(12) United States Patent
Tanaka et al.

(10) Patent No.: US 9,204,573 B2
(45) Date of Patent: Dec. 1, 2015

(54) POWER CONVERSION APPARATUS

(71) Applicant: KABUSHIKI KAISHA TOSHIBA, Minato-ku (JP)

(72) Inventors: Shoichiro Tanaka, Kuwana (JP); Masami Hirata, Yokkaichi (JP); Hideki Hisada, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 128 days.

(21) Appl. No.: 14/197,407

(22) Filed: Mar. 5, 2014

(65) Prior Publication Data

US 2014/0334102 A1    Nov. 13, 2014

(30) Foreign Application Priority Data

May 8, 2013   (JP) .................................. 2013-098267

(51) Int. Cl.
*H05K 7/20* (2006.01)
*H02M 7/53* (2006.01)

(52) U.S. Cl.
CPC ............. *H05K 7/20236* (2013.01); *H02M 7/53* (2013.01); *H05K 7/20927* (2013.01)

(58) Field of Classification Search
CPC .................... H05K 7/20927; F28D 2021/0029
See application file for complete search history.

(56) References Cited

U.S. PATENT DOCUMENTS

| | | | | |
|---|---|---|---|---|
| 6,917,188 B2* | 7/2005 | Kernahan | ............... | H02M 3/157 323/211 |
| 7,710,723 B2* | 5/2010 | Korich | ............... | H05K 7/20927 165/104.33 |
| 8,064,198 B2* | 11/2011 | Higashidani | ....... | H05K 7/20927 165/104.19 |
| 8,462,531 B2* | 6/2013 | Nishikimi | ............. | H02M 7/003 361/679.46 |
| 9,078,376 B2* | 7/2015 | Nishihara | ............. | H01L 23/367 |
| 2004/0060689 A1* | 4/2004 | Pfeifer | ...................... | F28F 3/12 165/80.4 |
| 2004/0062005 A1* | 4/2004 | Pfeifer | ...................... | F28F 3/12 361/699 |
| 2009/0021971 A1 | 1/2009 | Korich et al. | | |
| 2010/0328893 A1 | 12/2010 | Higashidani et al. | | |

FOREIGN PATENT DOCUMENTS

| | | |
|---|---|---|
| EP | 2 006 989 A2 | 12/2008 |
| EP | 2 151 913 A2 | 2/2010 |
| JP | 2011-109740 | 6/2011 |

OTHER PUBLICATIONS

Extended European Search Report issued Jul. 15, 2015 in Patent Application No. 14157825.2.

* cited by examiner

*Primary Examiner* — Gregory Thompson
(74) *Attorney, Agent, or Firm* — Oblon, McClelland, Maier & Neustadt, L.L.P.

(57) ABSTRACT

In general, according to an embodiment, a power conversion apparatus includes a first inverter, second inverter and a cooler. The first inverter includes a plurality of semiconductor devices connected together in parallel per phase. In the second inverter, the number of parallel-connected semiconductor devices are two or more per phase, the semiconductor devices are connected together in parallel and the number of parallel-connected semiconductor devices in the second inverter is fewer than that in the first inverter per phase. The semiconductor devices in the first inverter are installed in an area of a cooling surface of the cooler positioned over a first channel. The semiconductor devices in the second inverter are installed in an area of the cooling surface positioned over the second channel.

18 Claims, 10 Drawing Sheets

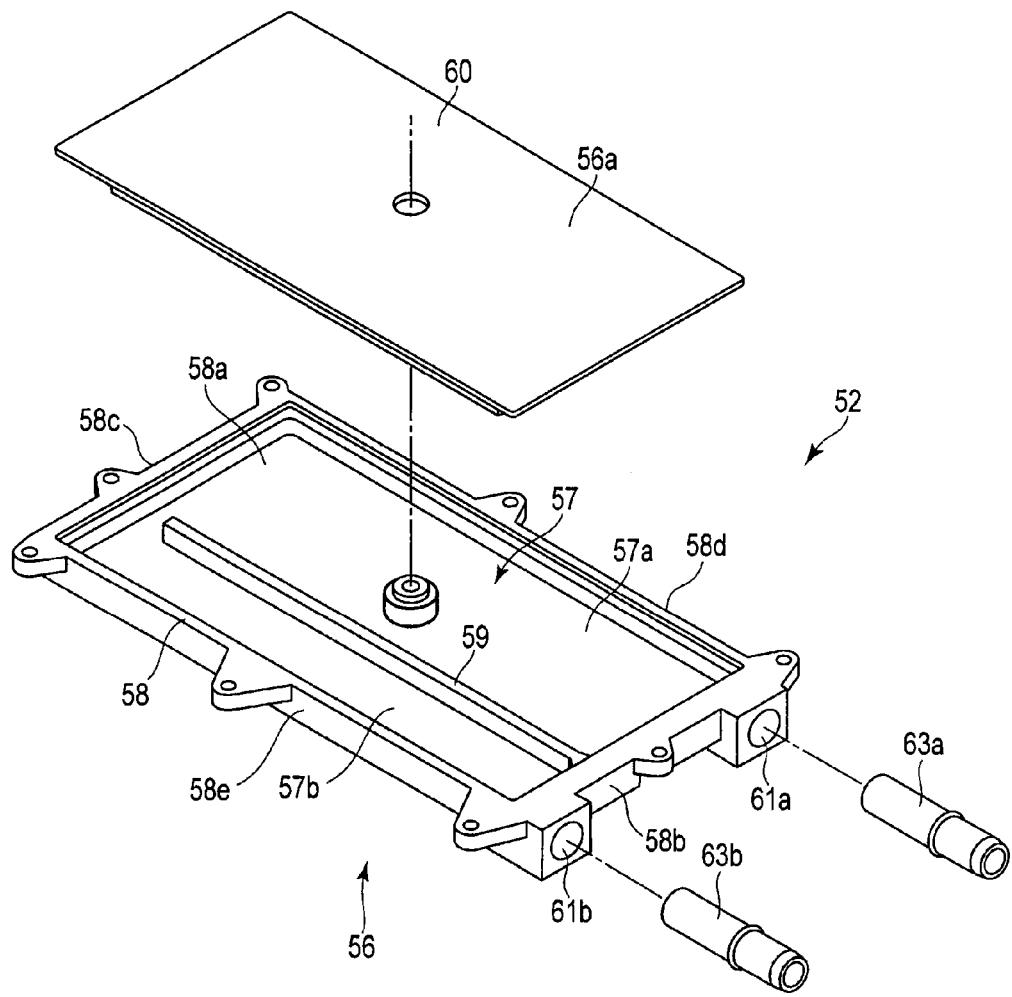
F I G. 4

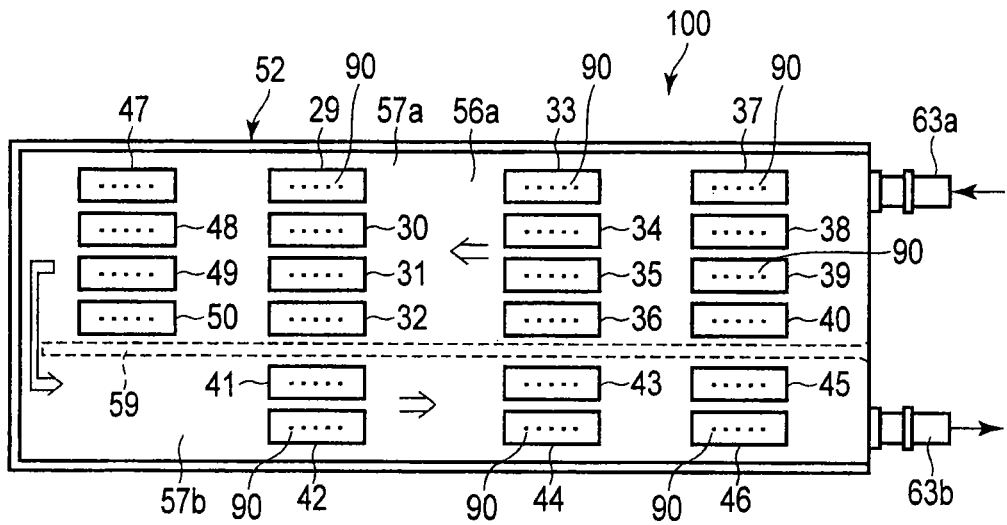
F I G. 8
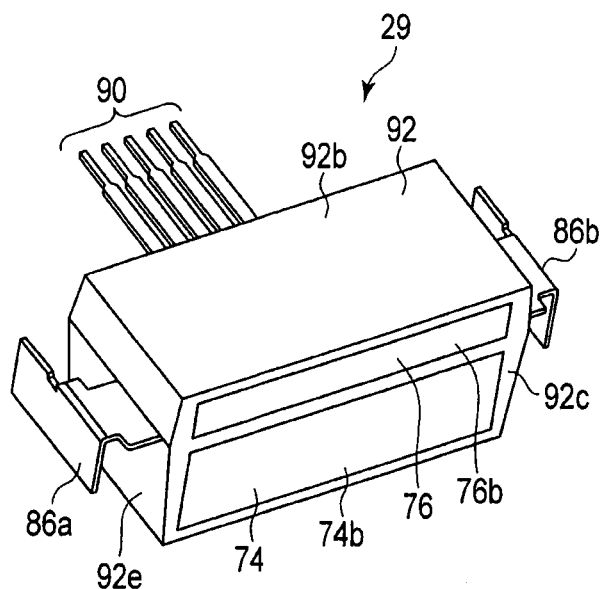
F I G. 9

POWER CONVERSION APPARATUS

CROSS-REFERENCE TO RELATED APPLICATION

This application is based upon and claims the benefit of priority from Japanese Patent Application No. 2013-098267, filed May 8, 2013, the entire contents of which are incorporated herein by reference.

FIELD

Embodiments described herein relate generally to a power conversion apparatus for a hybrid car or an electric car.

BACKGROUND

In recent years, hybrid cars using both an internal combustion engine and a motor have been rapidly prevailing in order to improve the fuel efficiency of the cars. On the other hand, electric cars that can travel using only a motor have been increasingly commercialized. Realization of these cars needs a power conversion apparatus provided between a battery and a motor to convert DC power into AC power and vice versa.

A well-known power conversion apparatus for hybrid cars comprises two inverters for driving a driving moor and a power generator and a DC-DC converter for boosting a power supply voltage. The inverters and the DC-DC converter use, as switching elements, semiconductor modules using IGBTs (Insulated Gate Bipolar Transistors). Among the components of the inverters and the DC-DC converter, the semiconductor modules generate a particularly large amount of heat. High performance is needed for a cooler that cools the semiconductor modules.

In general, a water-cooling cooler is used which uses, for example, water as a cooling medium. With a focus on the concentrated effects of heat generated by a semiconductor module installed on an upstream side of a refrigerant channel in the cooler on a semiconductor module installed on a downstream side of the refrigerant channel, a cooling structure has been proposed which avoids degradation of the cooling performance of the downstream semiconductor module.

BRIEF DESCRIPTION OF THE DRAWINGS

FIG. 4 is an exploded perspective view of the cooler;

FIG. 8 is a plan view of the cooler showing that a plurality of semiconductor modules are installed on a cooling surface of the cooler;

FIG. 9 is a perspective view showing a semiconductor module in the semiconductor power conversion apparatus;

DETAILED DESCRIPTION

In general, according to an embodiment, a power conversion apparatus includes a first inverter, a second inverter and a cooler.

The first inverter includes a plurality of sealed semiconductor devices each includes a switching element and connected together in parallel per phase. The semiconductor devices are controlled in such a manner as to operate in an identical switching state per phase.

In the second inverter, the number of parallel-connected semiconductor device is one or more per phase. Where there are two or more parallel-connected semiconductor devices, the semiconductor devices are connected together in parallel and the number of parallel-connected semiconductor devices in the second inverter is fewer than the number of parallel-connected semiconductor devices in the first inverter per phase. The semiconductor devices in the second inverter are controlled in such a manner as to operate in an identical switching state per phase.

The cooler includes a cooling block with a cooling surface on which the semiconductor devices are mounted, a refrigerant channel formed in the cooling block opposite the entire cooling surface, an inlet port and an outlet port each formed in a first side wall of the cooling block in communication with the refrigerant channel, and a partition wall provided in the refrigerant channel and extending linearly from the first side wall of the cooling block to a vicinity of a second side wall of the cooling block opposite to the first side wall to partition the refrigerant channel into a first channel communicating with the inlet port and a second channel communicating with the outlet port. The semiconductor devices in the first inverter are installed in an area of the cooling surface positioned over the first channel. The semiconductor devices in the second inverter are installed in an area of the cooling surface positioned over the second channel.

Semiconductor power conversion apparatuses according to some embodiments will be described below with reference to the drawings. The drawings are diagrams of the embodiments intended to aid in comprehending the embodiments and may show shapes, dimensions, and ratios different from those of the actual apparatus. However, the shapes, dimensions, and ratios can be appropriately designed and changed in consideration of the following description and well-known techniques.

First Embodiment

Figure 1:
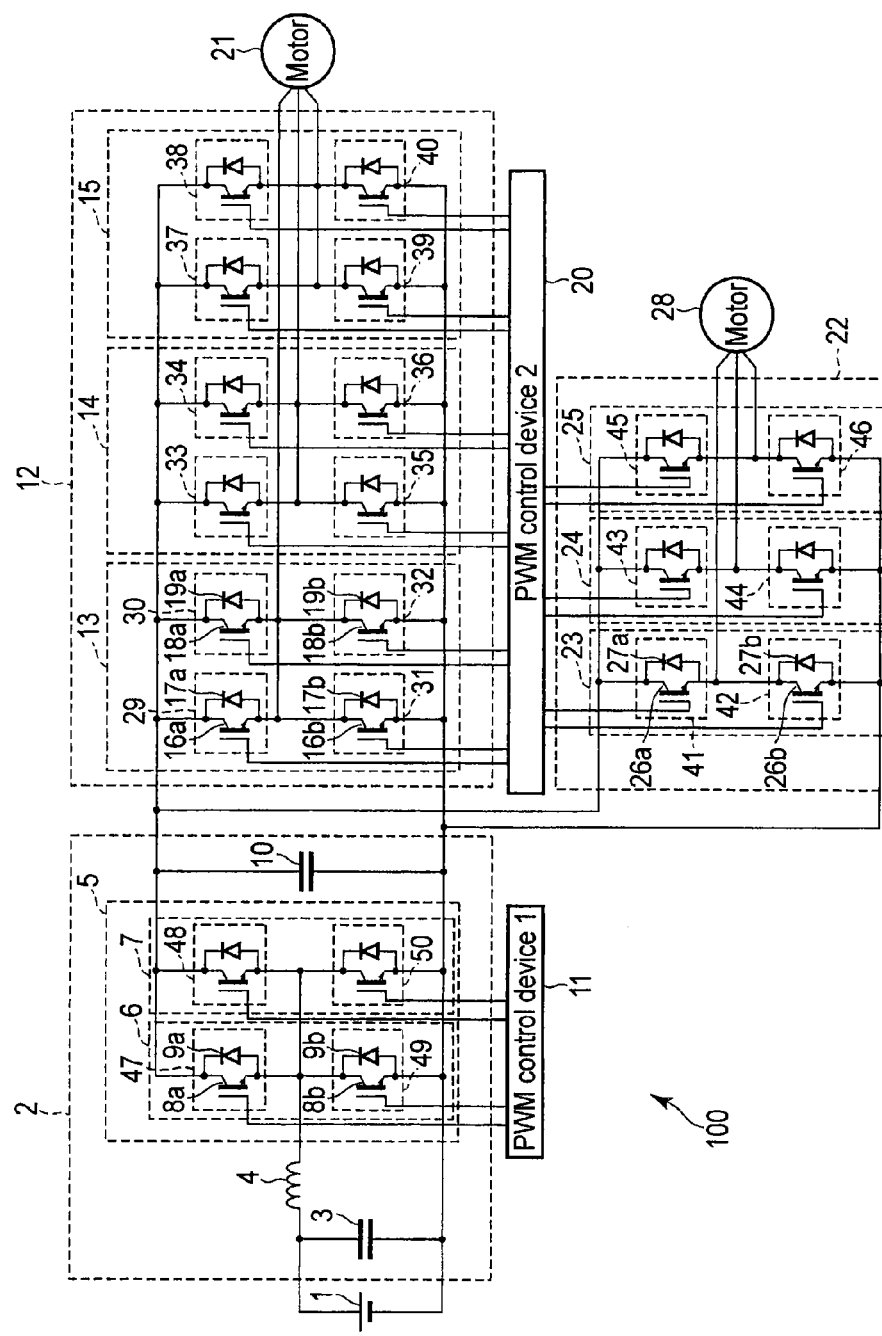
FIG. 1 is a diagram showing an equivalent circuit for a power conversion apparatus according to a first embodiment.

FIG. 1 is an equivalent circuit diagram of a power conversion apparatus according to a first embodiment. As shown in FIG. 1, a power conversion apparatus 100 comprises a first inverter 12 that converts DC power into AC power to drive a first motor 21, a second inverter 22 that converts DC power into AC power to drive a second motor 28, a DC-DC converter 2 that boosts a voltage supplied by a DC power supply 1 via an input capacitor 3 and a reactor 4 to apply the boosted voltage to a smoothing capacitor 10, a control device 20 that controls operation of the first and second inverters 12 and 22 based on current information and a voltage applied to the smoothing capacitor 10, and a control device 11 that controls operation of the DC-DC converter 2. Each of the first and second inverters 12 and 22 is configured as, for example, a three-phase inverter for a U phase, a V phase, and a W phase.

The first motor 21 is configured to generate higher power than the second motor 28. The first inverter is correspondingly configured to generate a maximum output power (first maximum output power) higher than a maximum power (second maximum output power) from the second inverter 22. The maximum power from the first inverter 12 is set a plurality of times, for example, twice as high as the maximum power from the second inverter 22. Thus, higher cooling performance is needed for the first inverter 12 than for the second inverter 22.

According to the first embodiment, the power conversion apparatus 100 comprises a plurality of semiconductor modules (semiconductor devices) of a 1-in-1 structure connected together in a series-parallel manner; in the 1-in-1 structure, a circuit with an IGBT element and an FWD (Free Wheeling Diode) element connected together in parallel is configured into one package. The plurality of semiconductor modules are configured to have the same structure and the same dimensions. The first inverter 12 comprises, for example, a total of twelve first semiconductor modules 29 to 40. The second inverter 22 comprises, for example, six second semiconductor modules 41 to 46. A group of semiconductor modules 5 for the DC-DC converter 2 comprises a total of 4 third semiconductor modules 47 to 50. According to the first embodiment, the first semiconductor modules 29 to 40, the second semiconductor modules 41 to 46, and the third semiconductor modules 47 to 50 have the same electrical specifications, the same configuration, and the same external dimensions.

In the first inverter 12, the four first semiconductor modules 29 to 32 provide a U-phase upper/lower arm 13. The four first semiconductor modules 33 to 36 provide a V-phase upper/lower arm 14. The four first semiconductor modules 37 to 40 provide a W-phase upper/lower arm 15.

For the U phase, an IGBT element 16a and an FWD element 17a in the first semiconductor module 29 are connected in parallel with an IGBT element 18a and an FWD element 19a in the first semiconductor module 30 to provide an upper arm. An IGBT element 16b and an FWD element 17b in the first semiconductor module 31 are connected in parallel with an IGBT element 18b and an FWD element 19b in the first semiconductor module 30 to provide a lower arm. The upper arm and the lower arm are connected together in series to provide a switching circuit for one phase.

The V-phase upper/lower arm 14 and the W-phase upper/lower arm 15 in the first inverter 12 are configured similarly to the U-phase upper/lower arm 13.

In the second inverter 22, the two second semiconductor modules 41 and 42 provide a U-phase upper/lower arm 23. The two second semiconductor modules 43 and 44 provide a V-phase upper/lower arm 24. The two second semiconductor modules 45 and 46 provide a W-phase upper/lower arm 25.

For the U phase, an IGBT element 26a and an FWD element 27a in the second semiconductor module 41 which are connected together in parallel provide an upper arm. An IGBT element 26b and an FWD element 27b in the second semiconductor module 42 which are connected together in parallel provide a lower arm. The upper arm and the lower arm are connected together in series to provide a switching circuit for one phase.

The V-phase upper/lower arm 24 and the W-phase upper/lower arm 25 in the second inverter 22 are configured similarly to the U-phase upper/lower arm 23.

As described above, in the plurality of first semiconductor modules 29 to 40 providing the first inverter 12, which is required to generate high power, a plurality of switching elements are connected together in parallel and controlled to operate in the same switching state. This allows current to be distributed to reduce heat generated per semiconductor module. Similarly, in the plurality of second semiconductor modules 41 to 46 providing the second inverter 22, which is required to generate low power, a plurality of switching elements controlled to operate in the same switching state are connected together in parallel. That is, the parallel-connected switching elements that are fewer than the parallel-connected switching elements in the first inverter 12 are connected together in parallel and controlled to operate in the same switching state. This allows current to be distributed to reduce heat generated per semiconductor module.

For the number of the parallel-connected semiconductor modules in the second switching circuit for each phase in the second inverter 22 fewer than the parallel-connected semiconductor modules in the first switching circuit for one phase in the first inverter 12, a plurality of modules need not necessarily be provided but a single device may be provided.

For the number of the semiconductor modules for each phase in the second inverter, that is, the parallel-connected semiconductor devices in the second inverter which are fewer than the parallel-connected semiconductor devices in the switching circuit for one phase in the first inverter, a plurality of devices need not necessarily be provided but a single device may be provided.

Where the number of parallel connected semiconductor modules is one, no semiconductor modules are connected together in parallel.

Furthermore, in the group of semiconductor modules 5 in the DC-DC converter 2, an IGBT element 8a and an FWD element 9a in a third semiconductor module 6 which are connected together in parallel provide an upper arm. An IGBT element 8b and an FWD element 9b in the third semiconductor module 6 which are connected together in parallel provide a lower arm. The upper arm and the lower arm are connected together in series to provide an upper/lower arm 6. An upper/lower arm 7 configured similarly to the upper/lower arm 6 is connected in parallel with the upper/lower arm 6.

Figure 2:
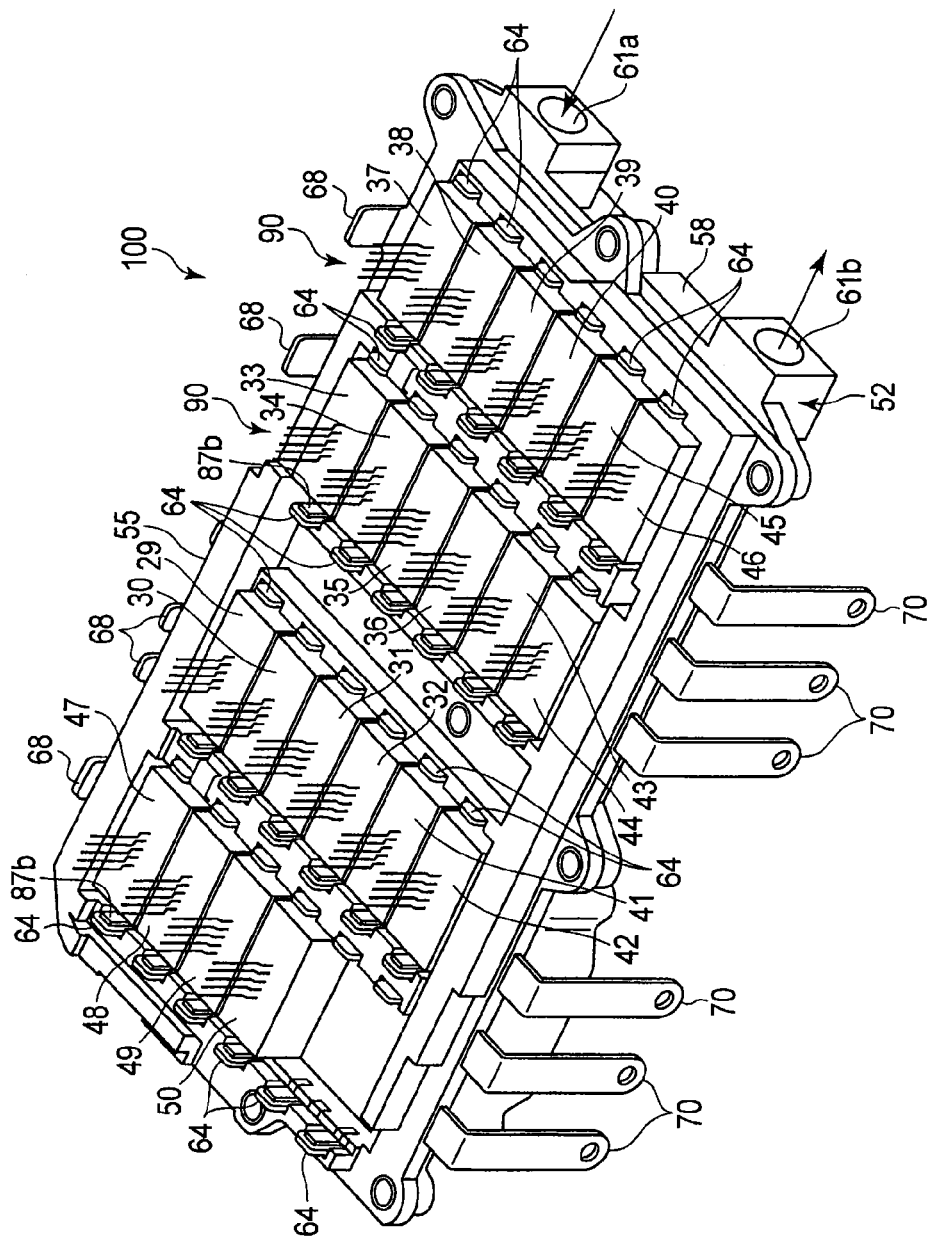
FIG. 2 is a perspective view showing the appearance of the power conversion apparatus.
Figure 3:
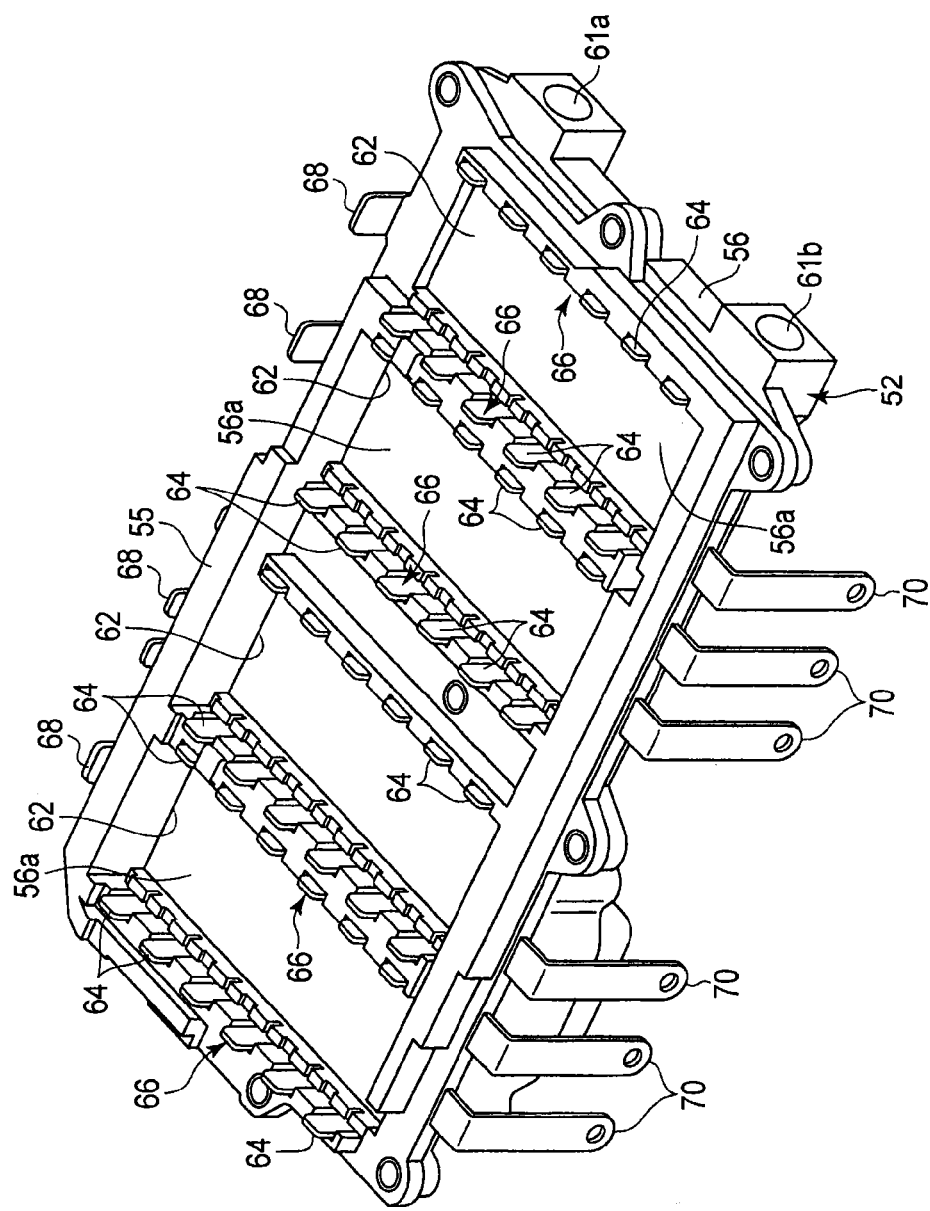
FIG. 3 is a perspective view showing a support frame and a cooler for the power conversion apparatus.

FIG. 2 is a perspective view showing the appearance of the semiconductor power conversion apparatus 100. FIG. 3 is a perspective view showing a support frame and a cooler for the semiconductor power conversion apparatus.

As shown in FIG. 2 and FIG. 3, the power conversion apparatus 100 comprises a cooler 52, a support frame 55 fixed on the cooler 52, and the plurality of semiconductor modules (semiconductor devices) 29 to 50 placed on the cooler 52 and supported by the support frame.

Figure 5:
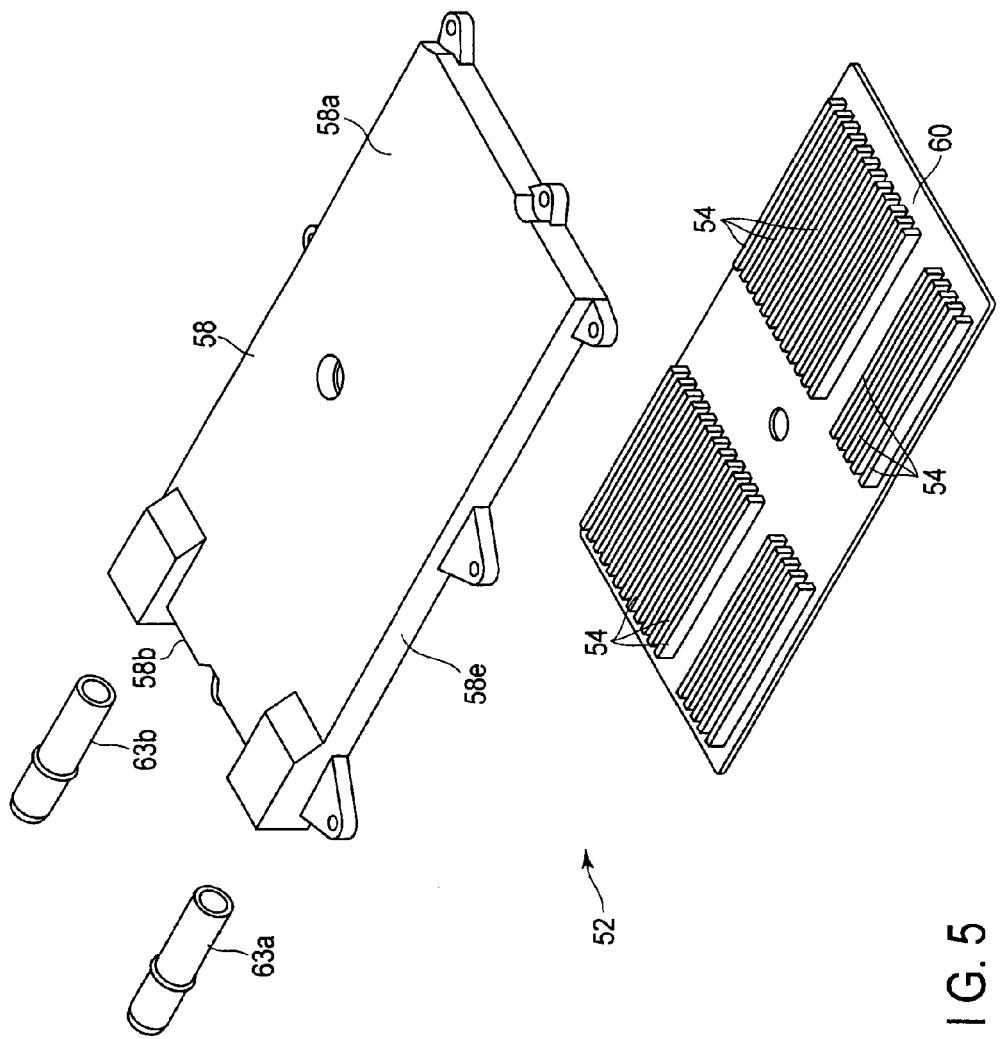
FIG. 5 is an exploded perspective view of the cooler as seen from a bottom surface side thereof.
Figure 6:
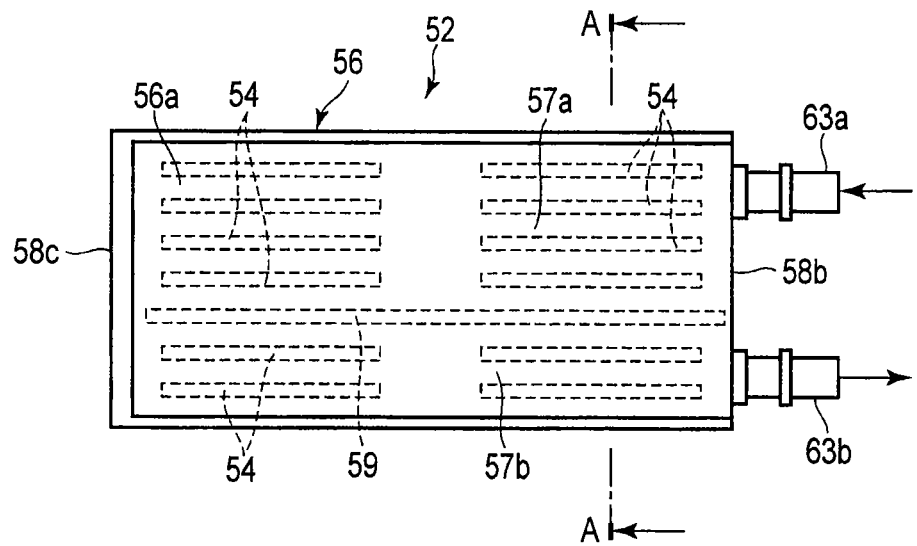
FIG. 6 is a plan view of the cooler.
Figure 7:
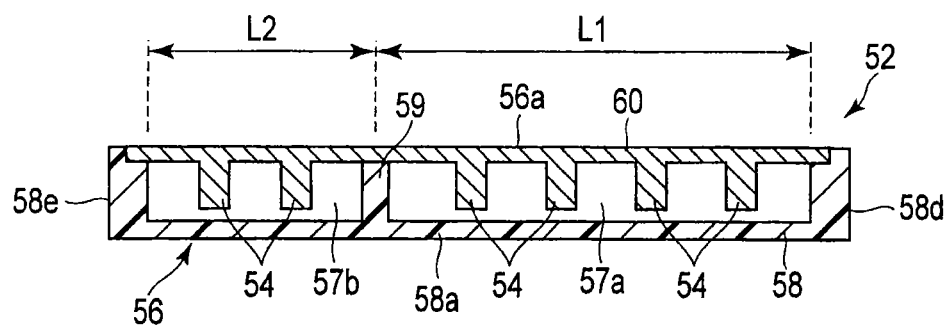
FIG. 7 is a cross-sectional view of the cooler taken along line A-A in FIG. 6.

FIG. 4 is an exploded perspective view showing the cooler. FIG. 5 is an exploded perspective view of the cooler as seen from a different direction. FIG. 6 is a plan view of the cooler. FIG. 7 is a cross-sectional view of the cooler taken along line A-A in FIG. 6.

As shown in FIG. 3 to FIG. 7, the cooler comprises a cooling block 56 shaped like a flat rectangular parallelepiped and comprising a flat rectangular cooling surface 56a. The cooling block 56 is formed of, for example, aluminum. Furthermore, a refrigerant channel 57 through which a cooling medium such as cooling water flows is formed in the cooling block 56.

The cooling block 56 comprises a flat rectangular main body 58 and a cover 60 shaped like a rectangular plate and covering an opening in the main body 58. The main body 58 integrally comprises a rectangular bottom wall 58a and side walls 58a, 58b, 58c, 58d, and 58e provided upright around the bottom wall. Furthermore, a partition wall 59 is provided upright on the bottom wall 58a of the main body 58. The partition wall 59 extends linearly along a longitudinal direction of the main body 58 from the side wall 58b on a longitudinal one end side of the main body 58 to the vicinity of the side wall 58c on a longitudinal other end side of the main body 58. Thus, a refrigerant channel 57 of a U-turn structure through which a cooling medium flows is formed in the main body 58. That is, the refrigerant channel 57 is partitioned into an outgoing channel (first channel) 57a and an incoming channel (second channel) 57b. The side wall 58b of the main body 58 includes an inlet port 61a formed therein in communication with the outgoing channel 57a and an outlet port 61b formed therein in communication with the incoming channel 57b. The inlet port 61a and the outlet port 61b are arranged in approximately the same plane. An inlet pipe 63a is fitted in the inlet port 61a. An outlet pipe 63b is fitted in the outlet port 61b.

The outgoing channel 57a is defined between the longitudinal one side wall 58d of the main body 58 and the partition wall 59. The outgoing channel 57a extends so as to maintain a constant width along the longitudinal direction of the main body from the inlet port 61a side to the opposite end of the main body. Similarly, the incoming channel 57b is defined between the longitudinal other side wall of the main body 58 and the partition wall 59. The incoming channel 57b extends so as to maintain a constant width along the longitudinal direction of the main body from a longitudinal one end to the opposite end of the main body. At the end of the main body opposite to the inlet port 61a, the partition wall 59 is located at a slight distance from the side wall 58c of the main body 58 so that the outgoing channel 57a and the incoming channel 57b are in communication with each other through the gap between the partition wall 59 and the side wall 58c.

When, in a direction orthogonal to the partition wall 59, the width of the outgoing channel 57a is denoted by L1 and the width of the incoming channel 57b is denoted by L2, the ratio of L1 to L2 corresponds to the ratio of the number of the first semiconductor modules to the number of the second semiconductor modules. According to the first embodiment, the ratio of the width L1 of the outgoing channel 57a to the width L2 of the incoming channel 57b is set to approximately 2:1. The depth and length of the outgoing channel 57a are the same as the width and depth of the ingoing channel 57b.

The rectangular plate-shaped cover 60 is fixed to the main body 58 to cover the refrigerant channel 57 and lies opposite the outgoing channel 57a and incoming channel 57b of the refrigerant channel. An outer surface of the cover 60 provides a flat cooling surface 56a. Furthermore, cooling fins 54 are formed like elongate ribs and extend along a longitudinal direction of the cover 60. The cooling fins 54 are also provided parallel to one another at predetermined intervals in a width direction of the cover. When the cover 60 is attached to the main body 58, some of the cooling fins 54 are positioned in the outgoing channel 57a, whereas the other cooling fins 54 are positioned in the incoming channel 57b. The cooling fins 54 are all positioned approximately parallel to the partition wall 59. Additionally, each of the cooling fins 54 is located opposite and at a distance from the bottom wall 58a of the main body 58.

A cooling medium delivered to the cooler 52 through the inlet pipe 63a and the inlet port 61a flows through the outgoing channel 57a from one end toward the other end thereof. The cooling medium then flows through the gap between the partition wall 59 and the side wall 58c into the incoming channel 57b. The cooling medium further flows along the incoming channel 57b from one end to the other end thereof. The cooling medium is then discharged through the outlet pipe 63b and the outlet port 61b, formed in the same side wall 58b in which the inlet port 61a is formed. While flowing through the outgoing channel 57a, the cooling medium cools an area of the cooling surface 56a opposite to the outgoing channel 57a via the cooling fins 54 and the cover 60. Moreover, while flowing through the incoming channel 57b, the cooling medium cools an area of the cooling surface 56a opposite to the incoming channel 57b via the cooling fins 54 and the cover 60.

In general, the heat-transfer coefficient of the incoming channel 57b side of the cooling surface 56a is reduced due to the effect of heat generated on the outgoing channel 57a side. Thus, according to the first embodiment, the refrigerant channel is divided using the partition wall 59 so that the ratio of the channel width L1 of the outgoing channel 57a to the channel width L2 of the incoming channel 57b is substantially 2:1 as described above. Hence, the flow velocity of the cooling medium flowing through the incoming channel 57b can be increased to about double the flow velocity of the cooling medium on the outgoing channel 57a. This enables a decrease in the heat-transfer coefficient of the incoming channel 57b side of the cooling surface 56a to be suppressed.

Figure 10:
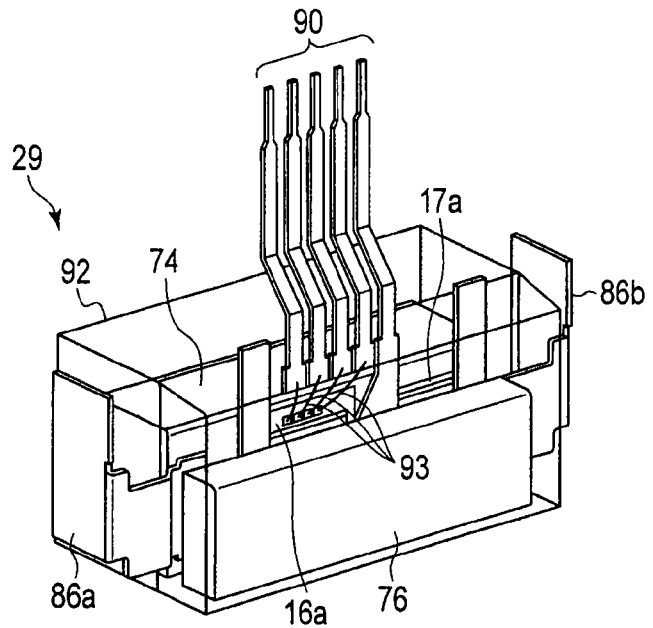
FIG. 10 is a transparent perspective view showing the internal structure of a mold resin body of the semiconductor module.

Now, the semiconductor module, for example, the first semiconductor module as a representative, will be described. FIG. 9 is a perspective view showing a semiconductor module. FIG. 10 is a transparent perspective view showing the internal structure of the first semiconductor module through a mold resin body.

As shown in FIG. 9 and FIG. 10, the first semiconductor modules 29 to 40 are configured as what is called a double sided heat radiation type and a vertical mounting type. That is, the first semiconductor module 29 comprises, for example, a first conductor (collector) 74 formed of copper and shaped like a prism, a second conductor (emitter) 76 also formed of copper and shaped like a prism, the IGBT element (switching element) 16a and the FWD element 17a sandwiched between the first conductor and the second conductor and joined to these conductors.

One principal surface (side surface) of the first conductor 74 provides a rectangular junction surface, and a bottom surface 74b of the first conductor 74 orthogonal to the junction surface provides a heat radiation surface. The second conductor 76 is formed to be approximately equal to the first conductor 74 in length and to be smaller than the first conductor 74 in thickness (width) and also in height. One principal surface (side surface) of the second conductor 76 provides a rectangular junction surface, and a bottom surface 76b of the second conductor 76 orthogonal to the junction surface provides a heat radiation surface. The second conductor 76 is disposed such that the junction surface of the second conductor 76 lies opposite and parallel to the junction surface of the first conductor 74 and so that the bottom surface 76b is flush with the bottom surface 74b of the first conductor 74.

The IGBT element 16a is shaped like a rectangular plate and provides different electrodes on a front surface and a back surface thereof, respectively. Furthermore, a plurality of, for example, four connection terminals are formed on one surface of the IGBT element 16a. The FWD element 17a is shaped like a rectangular plate and provides different electrodes on a front surface and a back surface thereof, respectively.

The IGBT element 16a is disposed parallel to the junction surface of the first conductor 74. One of the electrodes of the IGBT element 16a is joined to the junction surface of the first conductor 74, for example, by a rectangular solder sheet. The other electrode of the IGBT element 16a is electrically joined to the junction surface of the second conductor 76 via a protruding conductor (not shown in the drawings).

The FWD element 17a is disposed parallel to the junction surface of the first conductor 74 and in juxtaposition with the IGBT element 16a with a gap between the FWD element 17a and the IGBT element 16a in a longitudinal direction of the first conductor 74. One of the electrodes of the FWD element 17a is joined to the junction surface of the first conductor 74, for example, by a rectangular solder sheet. The other electrode of the FWD element 17a is electrically joined to the junction surface of the second conductor 76 via a protruding conductor (not shown in the drawings).

The first semiconductor module 29 comprises a first power terminal 86a and a second power terminal 86b each being made of a conductive metal plate and a plurality of, for example, five signal terminals 90. The first power terminal 86a comprises a proximal end joined to the junction surface of the first conductor 74 by a solder sheet. The second power terminal 86b comprises a proximal end connected to the second conductor 76. The signal terminals 90 protrude upward from the module and extend parallel to the junction surface of the first conductor 74. The five signal terminals 90 are juxtaposed in a longitudinal direction of the semiconductor module 29. A proximal end of each of the signal terminals 90 is connected to the corresponding connection terminal of the IGBT element 16a by a bonding wire 93.

The first semiconductor module 29 comprises an insulating material coated with the above described component, for example, a mold resin body (insulator) 92. The mold resin body 92 is shaped approximately like a rectangular parallelepiped. The mold resin body 92 comprises a flat bottom surface 92c extending perpendicularly to the IGBT element 16a and the FWD element 17a and from which a bottom surface 74b of the first conductor 74 and a bottom surface 76b of the second conductor 76 are exposed, a flat first side surface 92a extending perpendicularly to the bottom surface 92c, a second side surface 92b opposite and parallel to the first side surface 92a, a top surface 92d opposite to the bottom surface 92c, a first end surface 92e extending so as to intersect the bottom surface 92c and one end of each of the first and second side surfaces, and a second end surface 92e extending so as to intersect the bottom surface 92c and the other end of each of the first and second side surfaces. According to the first embodiment, the first and second side surfaces 92a and 92b are positioned parallel to the junction surfaces of the first and second conductors 74 and 76, respectively.

The first power terminal 86a projects from the one end surface 92e of the mold resin body 92 in a longitudinally outward direction of the mold resin body. The second power terminal 86b projects from the other end surface 92e of the mold resin body 92 in the longitudinally outward direction of the mold resin body. The first and second power terminals 86a and 86b are formed of a material with high conductivity and an excellent spring property, for example, phosphor bronze, nickel silver, a copper-beryllium for springs, or a copper-titanium alloy.

As described above, the second semiconductor modules 41 to 46 and the third semiconductor modules 47 to 50 are each formed to have the same configuration, electrical specifications, and external dimensions as those of each of the first semiconductor modules 29 to 40.

The plurality of first to third semiconductor modules configured as described above are installed on the cooling surface 56a of the cooler 52. As shown in FIG. 2 and FIG. 3, a support frame 55 fixed on the cooler 52 integrally comprises a rectangular outer frame with a size corresponding to the cooling surface 56a and a plurality of parallel connection beams extending between longitudinal portions of the outer frame. The outer frames and the connection beams form, for example, rectangular installation space portions 62 arranged in four rows. Furthermore, the support frame 55 includes a plurality of main circuit bus bars (main circuit conductors) 66 with a plurality of connection terminals 64 electrically connected to semiconductor modules, a plurality of input terminals 68, and two sets of three-phase output terminals 70. A plurality of the connection terminals 64 of the main circuit bus bars 66 are juxtaposed at intervals along a side edge of each of the installation space portions 62. Additionally, each of the connection terminals 64 extends approximately perpendicularly to the cooling surface 56a. The connection terminal 64 is formed of, for example, oxygen-free copper. The support frame 55 is formed of resin integrally with the main circuit bus bars 66 and a plurality of terminals by means of, for example, insert molding. In addition, the support frame 55 is fixed on the cooling surface 56a of the cooling block 56 by a plurality of screws.

Figure 11:
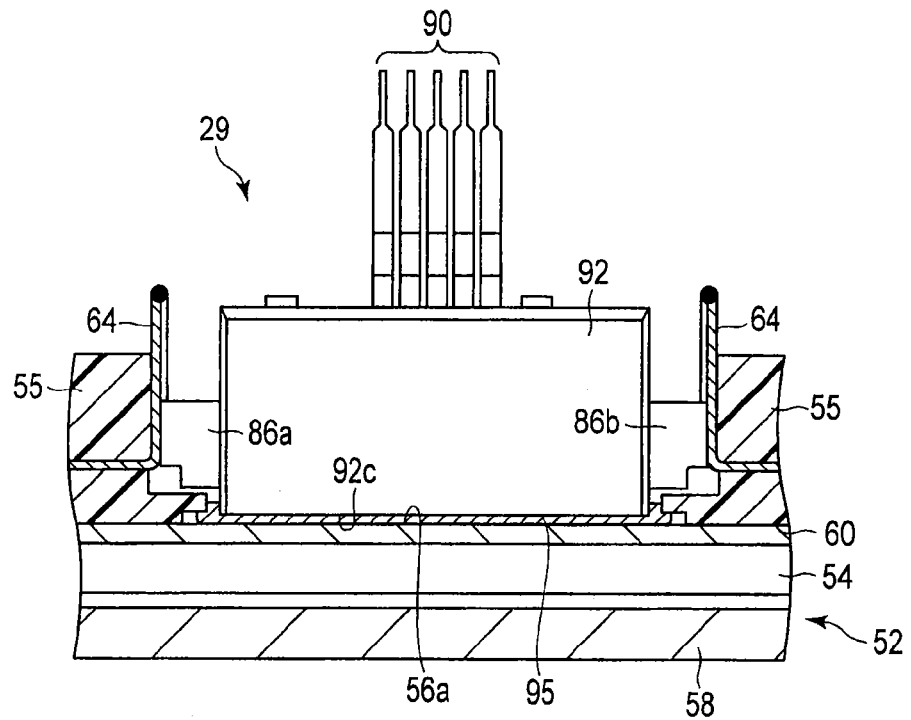
FIG. 11 is a front view showing the semiconductor module installed on the cooler and connected to connection terminals.

As shown in FIG. 2 and FIG. 8, for the first semiconductor modules 29 to 40 and the second semiconductor modules 41 to 46, for example, three rows in each of which six semiconductor modules are arranged are installed in the support frame 14 so as to extend in a width direction of the cooling surface 56a. Furthermore, the third semiconductor modules 47 to 50 are arranged in the support frame 14 in a row in the width direction of the cooling surface 56a. In each of the rows, the semiconductor modules are arranged in the installation space portion 62 of the support frame 55 and set such that the longitudinal direction of the semiconductor modules aligns with a longitudinal direction of the cooling surface 56a, that is, such that the longitudinal direction of the semiconductor modules lies parallel to the partition wall 59. As shown in FIG. 11, a bottom surface 52c of each semiconductor module is installed on the cooling surface 56a of the cooler 52 via a high thermal conducting material (insulating material) 95. Thus, the first and second conductors 74 and 76 are thermally connected to the cooler 52 and can release heat generated by the IGBT element and the FWD element to the cooler 52 via the first and second conductors 74 and 76. The first and second power terminals 46a and 46b of each semiconductor module are each in surface contact with the corresponding connection terminal 64 of the main circuit bus bar 66. Moreover, a tip of each power terminal and a tip of the connection terminal are joined together by welding. This allows the semiconductor module to be electrically connected to the main circuit bus bar 66 via the first and second power terminals 76a and 76b and the connection terminal 64. Additionally, a plurality of signal terminals 50 of each semiconductor module 16 project upward.

As shown in FIG. 2 and FIG. 8, in each row, the first semiconductor modules 29 to 40 providing the first inverter 12, which generates higher power than the second inverter 22, are arranged on an area of the cooling surface 56a opposite to the outgoing channel 57a, which has high cooling performance. Furthermore, the second semiconductor modules 41 to 46 providing the second inverter 22 are arranged on an area of the cooling surface 56a opposite to the incoming channel 57b, which has lower cooling performance than the outgoing channel 57a. Moreover, the group of semiconductor modules 47 to 50 for the DC-DC converter 2 is arranged on an area located in the outgoing channel 57a on a downstream side of the first semiconductor modules of the first inverter and opposite the outgoing channel 57a.

In other words, the first semiconductor modules 29 to 40 in the first inverter 12, the third semiconductor modules 47 to 50 in DC-DC converter 2 and the second semiconductor modules 23 to 46 in the second inverter 22 are installed in an area of the cooling surface 56a of the cooler 56 which lies opposite the refrigerant channel 57 in a manner that the first semiconductor modules 29 to 40 in the first inverter 12, the third semiconductor modules 47 to 50 in DC-DC converter 2 and the second semiconductor modules 23 to 46 in the second inverter 22 are arranged in series in the direction from upstream to downstream.

The twelve first semiconductor modules 29 to 40 are arranged such that the longitudinal direction of each of the semiconductor modules lies parallel to the partition wall 59 and such that long sides (longitudinal direction) of the bottom surfaces 74b and 76b of the first and second conductors 74 and 76 are positioned parallel to the partition wall 59. In the area opposite to the outgoing channel 57a, having high cooling performance, the twelve first semiconductor modules 29 to 40 are separately arranged in four rows that are parallel to the partition wall 59. In each row, the signal terminals 90 of the three first semiconductor modules are positioned in juxtaposition on a virtual line that is parallel to the partition wall 59.

The six second semiconductor modules 41 to 46 are arranged such that the longitudinal direction of each of the semiconductor modules lies parallel to the partition wall 59 and such that long sides (longitudinal direction) of the bottom surfaces 74b and 76b of the first and second conductors 74 and 76 are positioned parallel to the partition wall 59. In the area opposite to the incoming channel 57b, the six second semiconductor modules 41 to 46 are separately arranged in two rows that are parallel to the partition wall 59. In each row, the signal terminals 90 of the three second semiconductor modules are positioned in juxtaposition on a virtual line that is parallel to the partition wall 59.

When the ratio of the channel width L1 of the outgoing channel 57a to the channel width L2 of the incoming channel 57b is substantially 2:1 and when the first semiconductor modules 29 to 40 in the first inverter 12 are arranged in the area over the outgoing channel 57a, the second semiconductor modules 41 to 46 in the second inverter 22 are arranged in the area over the incoming channel 57b, and the semiconductor modules 47 to 50 for the DC-DC converter are arranged in the area over the outgoing channel 57a, then the power modules of the same power conversion apparatus are prevented from being disposed across the outgoing channel 57a and the incoming channel 57b. This allows a possible thermal variation among the semiconductor modules in the power conversion apparatus to be suppressed.

The power conversion apparatus 100 configured as described above uses the cooler 52 with a simpler cooling structure, in which the refrigerant channel is separated into the outgoing channel and the incoming channel. Then, the channel widths of the outgoing channel and the incoming channel are adjusted to enable a possible difference in cooling performance between the outgoing channel and the incoming channel to be suppressed. Furthermore, with regard to cooling, the group of semiconductor modules generating a large amount of heat is arranged in the area over the outgoing channel with high cooling performance, whereas the group of semiconductor modules generating a small amount of heat is arranged in the area over the incoming channel with low cooling performance. This enables a possible thermal variation among the semiconductor modules in the same power conversion apparatus to be suppressed, allowing the cooling performance of the power conversion apparatus as a whole to be improved.

In the first embodiment, the partition wall 59 in the cooler 52 need not necessarily be installed on the cooler main body but may be provided on the cover 60 side. Furthermore, the cooling fins 54 need not necessarily be installed on the cover 60 but may be provided on the bottom wall of the main body 58. The ratio of the channel width L1 of the outgoing channel 57a to the channel width L2 of the incoming channel 57b is not limited to 2:1 but may be changed as necessary.

Now, a power conversion apparatus according to another embodiment will be described. In the embodiment described below, the same components as those described in the first embodiment are denoted by the same reference numerals, and the detailed description of these components is omitted. Differences from the first embodiment will mainly be described.

Second Embodiment

Figure 12:
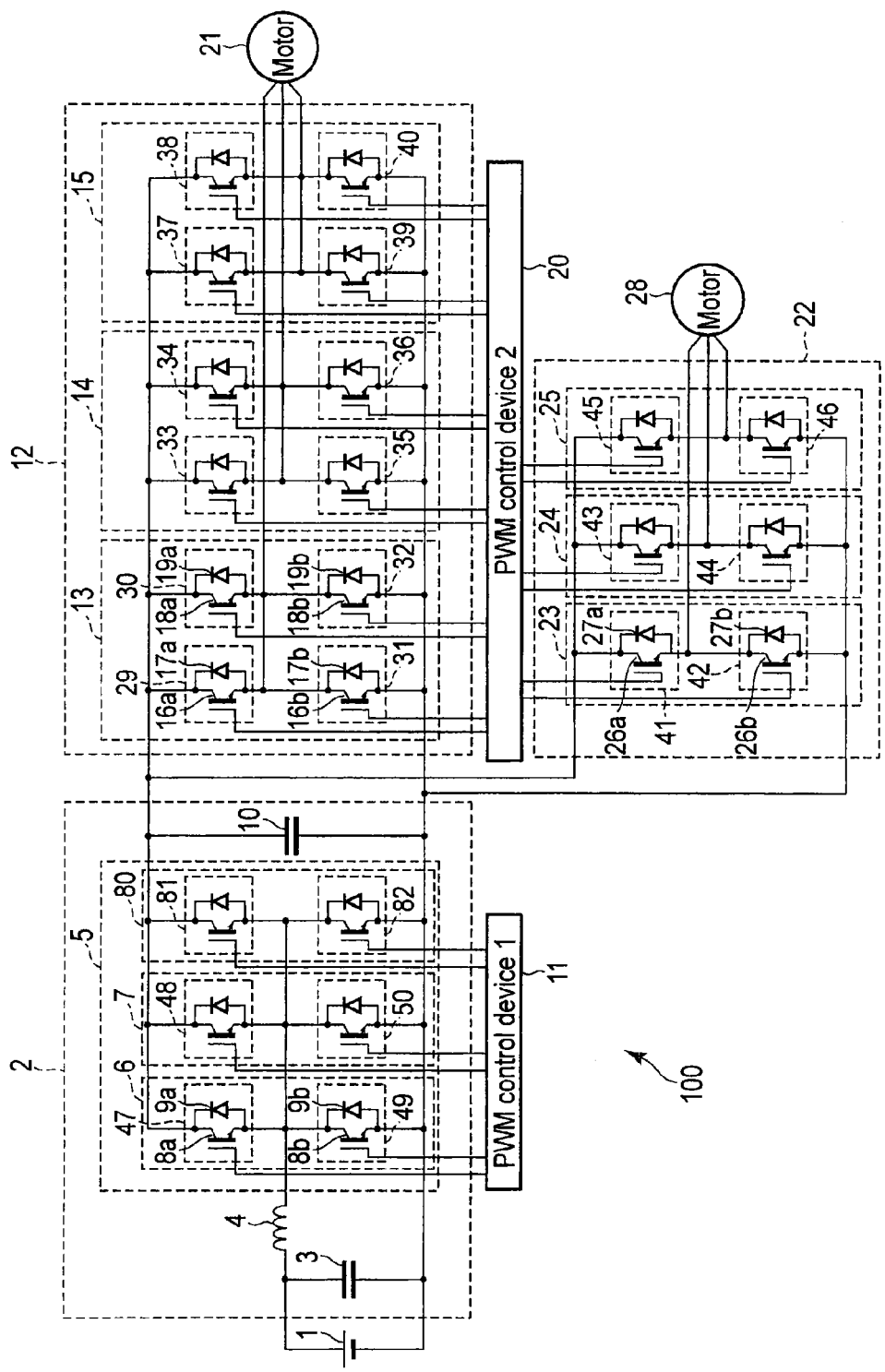
FIG. 12 is a diagram showing an equivalent circuit for a power conversion apparatus according to a second embodiment.
Figure 13:
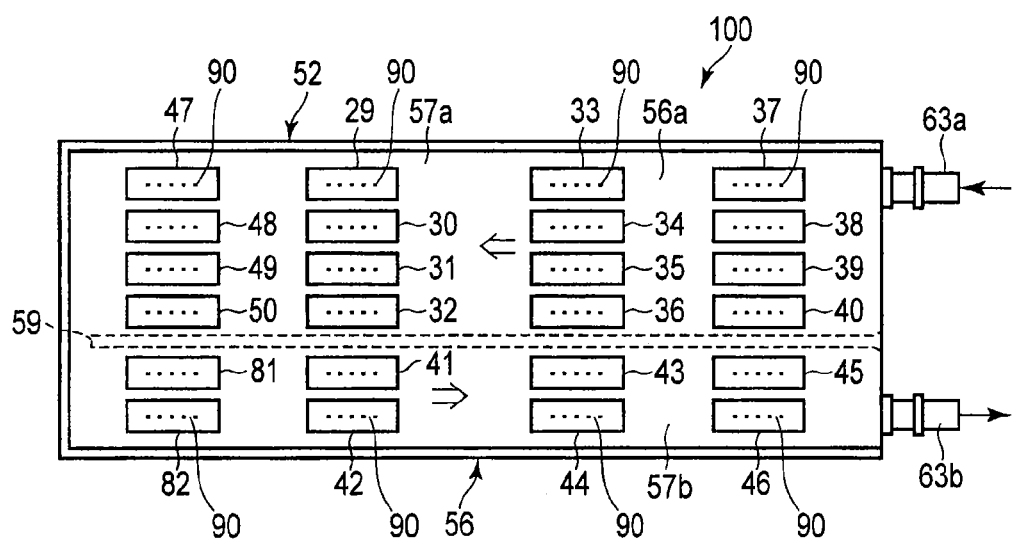
FIG. 13 is a plan view of a cooler showing that a plurality of semiconductor modules are installed on a cooler in the power conversion apparatus according to the second embodiment.

FIG. 12 is an equivalent circuit diagram of a power conversion apparatus according to the second embodiment. FIG. 13 is a plan view of the power conversion apparatus.

A power conversion apparatus 100 according to the second embodiment is configures as follows. As shown in FIG. 12 and FIG. 13, a group of semiconductor modules 5 in a DC-DC converter 2 comprises an upper/lower arm 6 including an upper arm with an IGBT element 8a and an FWD element 9a connected together in parallel and a lower arm with an IGBT element 8b and an FWD element 9b connected together in parallel, the upper arm and the lower arm being connected together in series. The group of semiconductor modules 5 further comprises an upper/lower arm 7 and an upper/lower arm 80 both configured similarly to the upper/lower arm 6, and the upper arms 6, 7, and 80 are connected together in parallel.

That is, the group of semiconductor modules 5 in the DC-DC converter 2 comprises a total of six third semiconductor modules of the 1-in-1 type 47 to 50, 81, and 82. As shown in FIG. 13, the six third semiconductor modules are arranged across an outgoing channel (first channel) 57a and an incoming channel 57b (second channel) of a refrigerant channel 57. The four third semiconductor modules 47 to 50 are arranged in an area of a cooling surface 56a of the cooler 52 which lies opposite the outgoing channel 57a. The remaining two third semiconductor modules 81 and 82 are arranged in an area of the cooling surface 56a opposite to the incoming channel 57b. Thus, the six third semiconductor modules are installed in a row so that the longitudinal direction of each of the third semiconductor modules is parallel to the longitudinal direction of the cooling surface 56a, that is, to the partition wall 59.

The remaining portion of the configuration of the power conversion apparatus 100 is similar to the corresponding portion of the configuration of the power conversion apparatus according to the first embodiment.

The power conversion apparatus according to the second embodiment is effective when high thermal performance is needed for the group of semiconductor modules in the DC-DC converter 2. The power semiconductor modules are separately arranged in three rows to reduce a value for current per semiconductor module. This enables a reduction in generated heat. The group of third semiconductor modules in the DC-DC converter is arranged across the outgoing channel and the incoming channel but prevented from being affected by heat generated by first semiconductor modules and second semiconductor modules. Furthermore, also in the second embodiment, the group of first semiconductor modules generating a large amount of heat is arranged in the area over the outgoing channel, which has high cooling performance, whereas the group of second semiconductor modules generating a small amount of heat is arranged in the area over the outgoing channel, which has low cooling performance. Thus, a possible thermal variation among the semiconductor modules in the same power conversion apparatus is suppressed, thus allowing the cooling performance of the power conversion apparatus as a whole to be improved.

For example, the dimensions, shapes, materials and so on of the components of the power conversion apparatus are not limited to the above-described embodiments but may be varied depending on the design of the power conversion apparatus. The number of installed semiconductor modules, the ratio of the numbers of installed semiconductor modules, and the ratio of the channel widths are not limited to the embodiments but may be changed as necessary.

While certain embodiments have been described, these embodiments have been presented by way of example only, and are not intended to limit the scope of the inventions. Indeed, the novel embodiments described herein may be embodied in a variety of other forms; furthermore various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power conversion apparatus comprising:
a first inverter comprising a plurality of sealed semiconductor devices each including a switching element and connected together in parallel, the semiconductor devices being controlled in such a manner as to operate in an identical switching state per phase;
a second inverter in which the number of parallel-connected semiconductor device is one or more, where there are two or more parallel-connected semiconductor devices, the semiconductor devices are connected together in parallel and the number of parallel-connected semiconductor devices in the second inverter is fewer than the number of parallel-connected semiconductor devices in the first inverter, and the semiconductor devices in the second inverter are controlled in such a manner as to operate in an identical switching state per phase; and
a cooler comprising a cooling block with a cooling surface on which the semiconductor devices are mounted, a refrigerant channel formed in the cooling block opposite the entire cooling surface, an inlet port and an outlet port each formed in a first side wall of the cooling block in communication with the refrigerant channel, and a partition wall provided in the refrigerant channel and extending linearly from the first side wall of the cooling block to a vicinity of a second side wall of the cooling block opposite to the first side wall to partition the refrigerant channel into a first channel communicating with the inlet port and a second channel communicating with the outlet port, wherein the semiconductor devices in the first inverter are installed in an area of the cooling surface positioned over the first channel, and the semiconductor devices in the second inverter are installed in an area of the cooling surface positioned over the second channel.

2. The power conversion apparatus according to claim 1, wherein a number of the semiconductor devices in the first inverter is a plurality of times as large as a number of the semiconductor devices in the second inverter, and in a direction orthogonal to the partition wall, a ratio of a width of the first channel to a width of the second channel corresponds to a ratio of the number of the semiconductor devices in the first inverter to the number of the semiconductor devices in the second inverter.

3. The power conversion apparatus according to claim 1, wherein a ratio of a width of the first channel to a width of the second channel is set approximately to 2:1.

4. The power conversion apparatus according to claim 1, wherein the cooling surface of the cooler is formed to be rectangular, and a direction in which the partition wall extends between the first channel and the second channel is set parallel to a longitudinal direction of the cooling surface.

5. The power conversion apparatus according to claim 4, wherein the semiconductor devices comprise respective rectangular installation surfaces formed to have an identical size and are installed on the cooling surface in such a manner that a longitudinal direction of the installation surface is parallel to a longitudinal direction of the partition wall.

6. The power conversion apparatus according to claim 1, further comprising a DC-DC converter with a plurality of the semiconductor devices, wherein the semiconductor devices in the first inverter, the semiconductor devices in the DC-DC converter and the semiconductor devices in the second inverter are installed in an area of the cooling surface of the cooler which lies opposite the refrigerant channel in a manner that the semiconductor devices in the first inverter, the semiconductor devices in the DC-DC converter and the semiconductor devices in the second inverter are arranged in series in the direction from upstream to downstream.

7. The power conversion apparatus according to claim 6, wherein the semiconductor devices in the DC-DC converter are connected together in parallel.

8. The power conversion apparatus according to claim 1, wherein the semiconductor devices in the first inverter and the semiconductor devices in the second inverter are formed to have an identical configuration and an identical size, and each comprise a first conductor and a second conductor which lie opposite each other with a gap between the first conductor and the second conductor, an IGBT element and a FWD element joined to the first conductor and the second conductor, an insulator shaped like a prism and covering the first and second conductor, and a plurality of signal terminals projecting outward from the insulator and electrically connected to the IGBT element, and each of the first and second conductors comprises a bottom surface exposed from a bottom surface of the insulator, and
the semiconductor device is installed in such a manner that the bottom surface of the insulator is installed on the cooling surface and that a longitudinal direction of the bottom surface of each of the first and second conductors is parallel to a longitudinal direction of the partition wall.

9. The power conversion apparatus according to claim 8, wherein the semiconductor devices in the first inverter are installed on the cooling surface in such a manner that the signal terminals are juxtaposed in such a manner as to lie on a virtual line parallel to the longitudinal direction of the partition wall, and the semiconductor devices in the second inverter are installed on the cooling surface in such a manner that the signal terminals are juxtaposed in such a manner as to lie on a virtual line parallel to the longitudinal direction of the partition wall.

10. A power conversion apparatus comprising:
a first inverter comprising a plurality of sealed semiconductor devices each including a switching element, the first inverter having a first maximum output power;
a second inverter comprising semiconductor devices which are fewer than the semiconductor devices in the first inverter and having a second maximum output power which is lower than the first maximum output power; and a cooler comprising a cooling block with a cooling surface on which the semiconductor devices are mounted, a refrigerant channel formed in the cooling block opposite the entire cooling surface, an inlet port and an outlet port each formed in a first side wall of the cooling block in communication with the refrigerant channel, and a partition wall provided in the refrigerant channel and extending linearly from the first side wall of the cooling block to a vicinity of a second side wall of the cooling block opposite to the first side wall to partition the refrigerant channel into a first channel communicating with the inlet port and a second channel communicating with the outlet port, wherein the semiconductor devices in the first inverter are installed in an area of the cooling surface positioned over the first channel, and the semiconductor devices in the second inverter are installed in an area of the cooling surface positioned over the second channel.

11. The power conversion apparatus according to claim 10, wherein a number of the semiconductor devices in the first inverter is a plurality of times as large as a number of the semiconductor devices in the second inverter, and in a direction orthogonal to the partition wall, a ratio of a width of the first channel to a width of the second channel corresponds to a ratio of the number of the semiconductor devices in the first inverter to the number of the semiconductor devices in the second inverter.

12. The power conversion apparatus according to claim 10, wherein a ratio of a width of the first channel to a width of the second channel is set approximately to 2:1.

13. The power conversion apparatus according to claim 10, wherein the cooling surface of the cooler is formed to be rectangular, and a direction in which the partition wall extends between the first channel and the second channel is set parallel to a longitudinal direction of the cooling surface.

14. The power conversion apparatus according to claim 13, wherein the semiconductor devices comprise respective rectangular installation surfaces formed to have an identical size and are installed on the cooling surface in such a manner that a longitudinal direction of the installation surface is parallel to a longitudinal direction of the partition wall.

15. The power conversion apparatus according to claim 10, further comprising a DC-DC converter with a plurality of the semiconductor devices, wherein the semiconductor devices in the first inverter, the semiconductor devices in the DC-DC converter and the semiconductor devices in the second inverter are installed in an area of the cooling surface of the cooler which lies opposite the refrigerant channel in a manner that the semiconductor devices in the first inverter, the semiconductor devices in the DC-DC converter and the semiconductor devices in the second inverter are arranged in series in the direction from upstream to downstream.

16. The power conversion apparatus according to claim 15, wherein the semiconductor devices in the DC-DC converter are connected together in parallel.

17. The power conversion apparatus according to claim 10, wherein the semiconductor devices in the first inverter and the semiconductor devices in the second inverter are formed to have an identical configuration and an identical size, and each comprise a first conductor and a second conductor which lie opposite each other with a gap between the first conductor and the second conductor, an IGBT element and a FWD element joined to the first conductor and the second conductor, an insulator shaped like a prism and covering the first and second conductor, and a plurality of signal terminals projecting outward from the insulator and electrically connected to the IGBT element, and each of the first and second conductors comprises a bottom surface exposed from a bottom surface of the insulator, and the semiconductor device is installed in such a manner that the bottom surface of the insulator is installed on the cooling surface and that a longitudinal direction of the bottom surface of each of the first and second conductors is parallel to a longitudinal direction of the partition wall.

18. The power conversion apparatus according to claim 17, wherein the semiconductor devices in the first inverter are installed on the cooling surface in such a manner that the signal terminals are juxtaposed in such a manner as to lie on a virtual line parallel to the longitudinal direction of the partition wall, and the semiconductor devices in the second inverter are installed on the cooling surface in such a manner that the signal terminals are juxtaposed in such a manner as to lie on a virtual line parallel to the longitudinal direction of the partition wall.

* * * * *